US008518833B2

United States Patent
Ichikawa et al.

(10) Patent No.: US 8,518,833 B2
(45) Date of Patent: Aug. 27, 2013

(54) TRANSPARENT ELECTROCONDUCTIVE OXIDE LAYER AND PHOTOELECTRIC CONVERTER USING THE SAME

(75) Inventors: Mitsuru Ichikawa, Nagaokakyo (JP); Fumiyasu Sezaki, Takasago (JP); Kenji Yamamoto, Kobe (JP)

(73) Assignee: Kaneka Corporation, Osaka (JP)

( * ) Notice: Subject to any disclaimer, the term of this patent is extended or adjusted under 35 U.S.C. 154(b) by 434 days.

(21) Appl. No.: 12/921,657

(22) PCT Filed: Mar. 13, 2009

(86) PCT No.: PCT/JP2009/054911
§ 371 (c)(1),
(2), (4) Date: Sep. 9, 2010

(87) PCT Pub. No.: WO2009/116467
PCT Pub. Date: Sep. 24, 2009

(65) Prior Publication Data
US 2011/0011461 A1    Jan. 20, 2011

(30) Foreign Application Priority Data
Mar. 18, 2008    (JP) .................. 2008-068780

(51) Int. Cl.
*H01L 21/31*    (2006.01)
(52) U.S. Cl.
USPC .................. 438/758; 257/E25.009
(58) Field of Classification Search
USPC ............... 438/758, 788, 57; 257/E25.009
See application file for complete search history.

(56) References Cited

U.S. PATENT DOCUMENTS

| 6,458,673 | B1 | 10/2002 | Cheung |
| 7,033,435 | B2* | 4/2006 | White et al. .................. 117/84 |
| 2006/0261447 | A1 | 11/2006 | Seto et al. |
| 2007/0157966 | A1* | 7/2007 | Meguro et al. ............... 136/258 |

FOREIGN PATENT DOCUMENTS

| EP | 1635361 A1 | 3/2006 |
| JP | 2001-007026 A | 1/2001 |
| JP | 2001-135149 A | 5/2001 |
| WO | 2004/112057 A1 | 12/2004 |

OTHER PUBLICATIONS

Azuma, JP2001-135149A, Machine Translation, May 2001.*
International Search Report of PCT/JP2009/054911, mailing date Apr. 21, 2009.

* cited by examiner

*Primary Examiner* — Brook Kebede
(74) *Attorney, Agent, or Firm* — Westerman, Hattori, Daniels & Adrian, LLP

(57) ABSTRACT

The present invention provides a transparent electroconductive oxide layer having a high transmittance and a high electroconductivity and further a thin-film photoelectric converter having a high photoelectric conversion efficiency by applying the transparent electroconductive oxide layer to a transparent electrode layer of a photoelectric converter. The transparent electroconductive oxide layer in the present invention is deposited on a transparent substrate with a first and a second impurities contained in the transparent electroconductive oxide layer, especially in the vicinity of a surface of the layer in a higher concentration, and carbon atoms contained in the vicinity of the surface of the layer, thereby achieving a high transmittance and a high electroconductivity simultaneously and thus solving the problem.

2 Claims, 3 Drawing Sheets

TRANSPARENT ELECTROCONDUCTIVE OXIDE LAYER AND PHOTOELECTRIC CONVERTER USING THE SAME

TECHNICAL FIELD

The present invention relates to a method of forming a transparent electroconductive oxide layer suitable for a thin-film photoelectric converter and a thin-film photoelectric converter using the same.

BACKGROUND ART

Thin-film photoelectric converters such as solar cells are manufactured, for example, by depositing a transparent electroconductive oxide layer such as zinc oxide, at least one photoelectric conversion layer, and a back electrode made of a metallic material in this order on a transparent substrate such as glass.

The use of a zinc oxide (ZnO) film as a transparent electroconductive oxide layer has been recently studied strenuously. This film excels a tin oxide ($SnO_2$) film in chemical stability such as resistance to plasma and is kept from degradation in film-formation of a photoelectric conversion layer by means of a plasma CVD method. There is a need for a transparent electroconductive oxide layer, which lets light pass through into a photoelectric conversion layer and functions as a transparent electrode, to have a high light transmittance and a high electroconductivity.

In order to achieve such a high electroconductivity, for example, a patent document 1 specified below discloses a technique to balance a transmittance and an electroconductivity by involving two kinds of impurities in a transparent electroconductive oxide layer so as to diminish a total amount of impurities so that a high light transmittance and a high electroconductivity of the transparent electroconductive oxide layer are achieved.

Patent Document 1: JP 2001-7026 A

DISCLOSURE OF INVENTION

Technical Problem

As described above, the present invention aims to obtain a transparent electroconductive oxide layer having a high transmittance and a high electroconductivity suitable for a thin-film photoelectric converter.

Solution to Problem

The present invention has been conceived after earnest consideration in order to solve the conventional problems and achieve the above-mentioned aim and has a configuration described below.

(1) A transparent electroconductive oxide layer deposited on a substrate and containing a first and a second impurities and carbon atoms, the layer having a first surface on the opposite side of the layer from the substrate and further an inner region, the first and the second impurities being contained in a higher concentration in the vicinity of the first surface than the inner region, and the carbon atoms being contained at least in the vicinity of the first surface.

(2) The transparent electroconductive oxide layer as described in (1), wherein the layer is composed of zinc oxide.

(3) The transparent electroconductive oxide layer as described in (1) or (2), wherein the first impurity contained in the layer is aluminum (Al) and the second impurity contained therein is boron (B).

(4) The transparent electroconductive oxide layer as described in one of the above-mentioned descriptions (1) to (3), wherein the layer containing the impurities in a higher concentration has a film thickness of 5 angstroms or more but not exceeding 1000 angstroms.

(5) A photoelectric converter including a transparent electroconductive oxide layer, at least one thin-film photoelectric conversion unit, and a back electrode, those being deposited in this order from a light incidence side, wherein one selected from the transparent electroconductive oxide layer and the back electrode has the configuration as described in one of the above-mentioned descriptions (1) to (4).

(6) A method of forming the transparent electroconductive oxide layer as described in one of the above-mentioned descriptions (1) to (5), including the steps of depositing the transparent electroconductive oxide layer containing the first impurity on the substrate, and plasma-treating in an atmosphere containing hydrocarbon gas and dopant gas containing the second impurity.

(7) The method as described in (6), wherein the hydrocarbon gas is composed of one selected from a group consisting of ethane, acetylene, and methane.

Advantageous Effect of Invention

The present invention increases a transmittance because of the shift in bandgap of the transparent electroconductive oxide layer to high energy by introduction of the two kinds of impurities in the layer. Further, the impurities contained in the vicinity of the surface of the layer in a higher concentration than those of the inner region enhance an electroconductivity at the interface, thereby increasing the electroconductivity with maintaining the high light transmittance of the entire layer.

Still further, because the enhanced electroconductivity of the interface with maintaining the high light transmittance of the layer as described above reduces a resistance in series, the use of the transparent electroconductive oxide layer in this invention as a transparent electrode of a photoelectric converter improves characteristics of the converter. According to the above-mentioned effects, the present invention provides a high-performance thin-film photoelectric converter.

Figure 1:
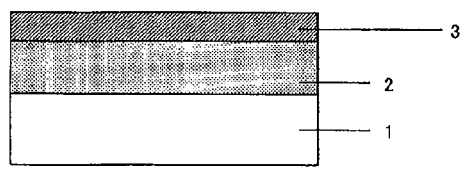
FIG. 1 is a structural sectional view of a transparent electroconductive oxide layer of an embodiment of the present invention.

BRIEF DESCRIPTION OF NUMERALS 1. transparent substrate
2. transparent electroconductive oxide layer
3. highly-conductive treated layer
4. photoelectric conversion unit
5. back electrode layer

BEST MODE FOR CARRYING OUT THE INVENTION

Now, a preferred embodiment of the present invention will be described in detail, making reference to the accompanying drawings. In each figure of the present application, dimensions such as a thickness and a length are appropriately modified for clarification and simplification of the figure and actual dimensions are not indicated. Further, the same reference characters denote the same part or the corresponding part in each figure.

FIG. 1 shows a cross section of a transparent electroconductive oxide layer in an embodiment of the present invention. There are provided a transparent electroconductive oxide layer 2 and a highly-conductive treated layer 3 deposited in this order on a transparent substrate 1.

The transparent substrate 1 used as a base relating to this invention in a photoelectric converter that is a type of light incident from a substrate side is made of a plate-like member or a sheet-like member composed of a material such as glass or transparent resin. The transparent electroconductive oxide layer 2 is preferably formed by a means such as CVD, sputtering, or evaporation. Further, the oxide layer 2 desirably has a surface having finely-patterned geometric irregularities so as to be effective in increasing of incident light scattering. The highly-conductive treated layer 3 contains two kinds of impurities for controlling the electroconductivity of the oxide layer and preferably contains the impurities in a higher concentration than in the oxide layer 2. Further preferably, the treated layer 3 contains carbon atoms.

Figure 2:
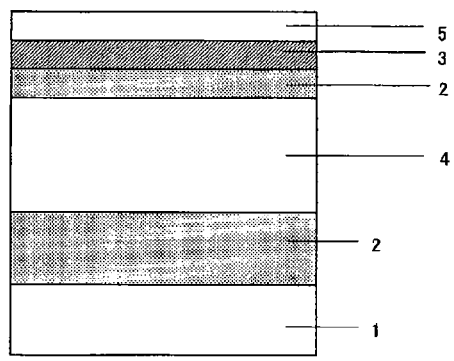
FIG. 2 is a structural sectional view of a thin-film photoelectric converter of an embodiment of the present invention.

FIG. 2 shows a cross section of a thin-film photoelectric converter of an embodiment of the present invention. There are provided the transparent electroconductive oxide layer 2, a photoelectric conversion unit 4, the further transparent electroconductive oxide layer 2, the highly-conductive treated layer 3, and a back electrode layer 5 deposited in this order on the transparent substrate 1. In FIG. 2, only one photoelectric conversion unit is shown, but it is possible to employ a multi-junction photoelectric converter in which a plurality of photoelectric conversion units are deposited.

The transparent substrate 1 used in the photoelectric converter that is a type of light incident from a substrate side is made of a plate-like member or a sheet-like member composed of a material such as glass or transparent resin. The transparent electroconductive oxide layer 2 is preferably formed by a means such as CVD, sputtering, or evaporation. Further, the oxide layer 2 desirably has a surface having finely-patterned geometric irregularities so as to be effective in increasing of incident light scattering.

The back electrode layer 5 is preferably formed by at least one metallic layer made of at least one selected from a group consisting of Al, Ag, Au, Cu, Pt, and Cr by either a sputtering method or an evaporation method.

The photoelectric conversion unit 4 is arranged behind the oxide layer 2 seeing from the light incidence side. The photoelectric conversion unit 4 employs a unit made of an amorphous silicon material for example. Every unit 4 is preferably constituted by a PIN junction including a p-layer, an i-layer that is substantially an intrinsic photoelectric conversion layer, and an n-layer. Among those units, a unit using amorphous silicon as the i-layer is referred to as an amorphous silicon photoelectric conversion unit.

An amorphous or crystalline silicon material may include not only a material using only silicon as an essential element constituting a semiconductor but also an alloyed material containing an element such as carbon, oxygen, nitrogen, or germanium. An essential component of a conductive layer needs not necessarily be such one as the i-layer and may use, for example, an amorphous silicon carbide as the p-layer of the amorphous silicon photoelectric conversion unit and also use a crystalline silicon layer (also referred to as μc-Si or microcrystalline silicon) as the n-layer.

After the film-formation of the photoelectric conversion unit 4, the further transparent electroconductive oxide layer 2 is prepared by a method such as CVD, sputtering, or evaporation, on which the highly-conductive treated layer 3 is laminated. The treated layer 3 contains two kinds of impurities (a first and a second impurities) for controlling the electroconductivity of the oxide layer and preferably contains the impurities in a higher concentration than in the oxide layer. Further preferably, the treated layer 3 contains carbon atoms.

The highly-conductive treated layer 3 in the present embodiment is preferably formed by a plasma-treatment in an atmosphere containing hydrocarbon gas and dopant gas containing the second impurity after formation of the transparent electroconductive oxide layer 2 containing the first impurity on the transparent substrate.

It is preferable to use hydrocarbon gas as a carrier gas in a highly-conductive treatment. The hydrocarbon gas is preferably selected from a group consisting of ethane, acetylene, and methane, and is more preferably methane. The present invention is not limited to use a pure hydrocarbon gas and may use another gas together. More specifically, the other gas is preferably hydrogen. The use of methane or methane and hydrogen achieves a favorable highly-conductive treatment. The second impurity for the treatment is preferably selected from elements consisting of boron (B), aluminum (Al), Gallium (Ga), and Indium (In) and more preferably selected from either boron or aluminum.

A plasma power in the treatment is not particularly limited but preferably in a range from 10 W to 600 W. A low plasma power may fail to provide an adequate treatment, whereas a high plasma power may etch the oxide layer 2 by plasma. The treated layer 3 preferably has a film thickness in a range from 5 angstroms to 1000 angstroms from its property, more preferably that from 5 angstroms to 200 angstroms, and most preferably that from 20 angstroms to 200 angstroms. In the present embodiment, the transparent electroconductive oxide layer of a light transmittance side is subjected to the highly-conductive treatment, but it is possible to form the highly-conductive treated layer 3 on the oxide layer of the light incidence side or on the both sides of the oxide layer, and embodiments are not limited to the best mode described above.

EXAMPLES

Now, various examples of a transparent electroconductive oxide layer and a thin-film photoelectric converter containing the transparent electroconductive oxide layer corresponding to the above-mentioned embodiments of the present invention will be described in detail below, making a comparison with some comparative examples. Yet, the present invention is not limited to the below-mentioned examples.

Example 1

A transparent electroconductive oxide layer of the Example 1 was prepared upon the first embodiment described making reference to FIG. 1. Glass was used for a transparent substrate 1, which was placed in a film-forming chamber of a sputtering device for depositing the transparent electroconductive oxide layer 2 consisting of zinc oxide on the substrate 1 by a sputter method. This film forming was performed using zinc oxide added with 2 wt % of Al as a sputter target, Ar gas as a sputter gas, and the substrate set at 150 degrees centigrade under a pressure of 0.27 Pa, so as to give a film thickness of 40 nm of zinc oxide by a DC sputtering method.

After the film forming of the transparent electroconductive oxide layer, a piece of sample was put in a plasma CVD device for forming a highly-conductive treated layer 3. This highly-conductive treatment was performed with a plasma CVD device for 20 minutes using 30 sccm (standard cubic centimeters) of methane (in concentration of 100% by volume), 310 sccm of hydrogen, and 0.05 sccm of diborane as materials and the substrate set at 180 degrees centigrade with a discharge power of 200 W.

Figure 3:
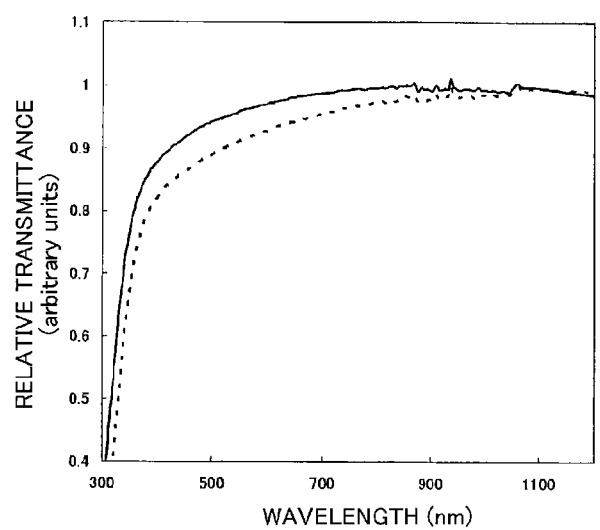
FIG. 3 shows a relative transmittance of a transparent electroconductive oxide layer prepared by a first example of the present invention and a relative transmittance of a transparent electroconductive oxide layer of a first comparative example, which has not been subjected to a highly-conductive treatment.

FIG. 3 shows a relative transmittance (solid line) of the transparent electroconductive oxide layer prepared by this example and a relative transmittance (dotted line) of a transparent electroconductive oxide layer of a Comparative Example 1, which has not been subjected to the highly-conductive treatment. The figure indicates that the highly-conductive treatment increased particularly the transmittance in a short-wavelength region.

Figure 4:
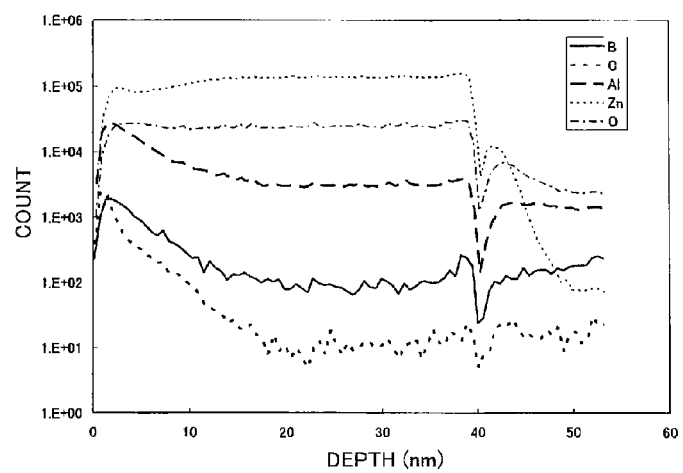
FIG. 4 shows an elemental depth profile of the transparent electroconductive oxide layer prepared by the first example of the present invention.

Further, FIG. 4 shows an elemental depth profile of the transparent electroconductive oxide layer prepared by the Example 1, which is measured by the SIMS method. The SIMS method is a mass spectrometry of secondary ions sputtered by radiation of primary ions. In the SIMS measurement in these examples, cesium was used as accelerated ions. The figure indicates that aluminum and boron were contained as impurities in a higher concentration in a region of 10 nm in the vicinity of the surface of the sample and that carbon was contained in the region.

The transparent electroconductive oxide layer prepared by the Example 1 showed a sheet resistance, as measured by the four-probe measurement, of 0.73 times of that in the Comparative Example 1, which has not been subjected to the highly-conductive treatment.

Comparative Example 1

The transparent electroconductive oxide layer in the Comparative Example 1 was formed in the same manner as the Example 1 except only that the highly-conductive treatment was not executed on the layer. The relative transmittance of the resulting transparent electroconductive oxide layer is shown in FIG. 3 (dotted line).

Example 2

A transparent electroconductive oxide layer in Example 2 was formed in the same manner as the Example 1 except only that the substrate was set at 30 degrees centigrade in formation of the highly-conductive treatment layer 3.

Figure 5:
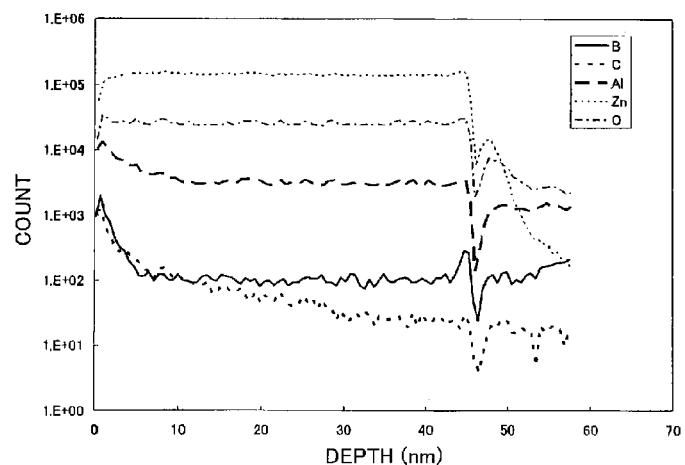
FIG. 5 shows an elemental depth profile of a transparent electroconductive oxide layer prepared by a second example of the present invention.

FIG. 5 shows an elemental depth profile of the transparent electroconductive oxide layer prepared by the Example 2, which was measured by the SIMS method. The figure indicates that aluminum and boron were contained as impurities in a higher concentration in a region of 5 nm in the vicinity of the surface of the sample and that carbon was contained in the region.

Comparison with the result of the Example 1 (FIG. 4) has confirmed that a lower temperature of the substrate in the formation of the highly-conductive treated layer failed to facilitate diffusion of the impurities into an inner region of the transparent electroconductive oxide layer, resulting in reduction of a thickness of the highly-conductive treated layer. However, by the four-probe measurement, the transparent electroconductive oxide layer prepared by the Example 2 had a sheet resistance of 0.90 times of that in the Comparative Example 1, which has not been subjected to the highly-conductive treatment. That means an effect by the present invention is expressed even when the highly-conductive layer is thin.

Comparative Example 2

A transparent electroconductive oxide layer in Comparative Example 2 was formed in the same manner as the Example 1 except only that a zinc oxide layer had a thickness of 50 nm, that the substrate was set at 150 degrees centigrade in formation of the highly-conductive treatment layer, and that diborane was not introduced.

Figure 6:
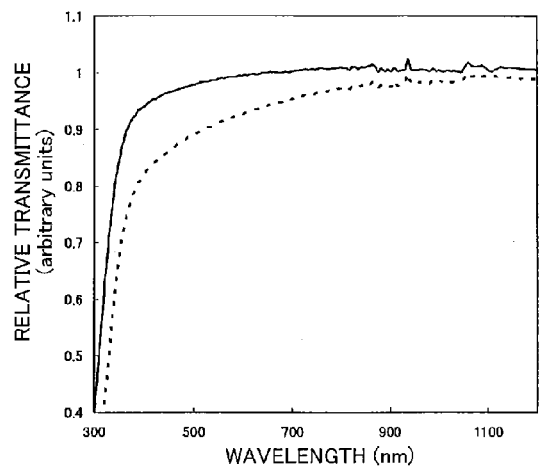
FIG. 6 shows a relative transmittance of a transparent electroconductive oxide layer prepared in a second comparative example and the relative transmittance of the transparent electroconductive oxide layer in the first comparative example, which has not been subjected to the highly-conductive treatment.

FIG. 6 shows a relative transmittance (solid line) of the transparent electroconductive oxide layer prepared in the Comparative Example 2 and the relative transmittance (dotted line) of the transparent electroconductive oxide layer in the Comparative Example 1, which has not been subjected to the highly-conductive treatment. The figure indicates that the highly-conductive treatment increased particularly the transmittance in a short-wavelength region and that the transmittance of the oxide layer was increased even with the second impurity not introduced.

Figure 7:
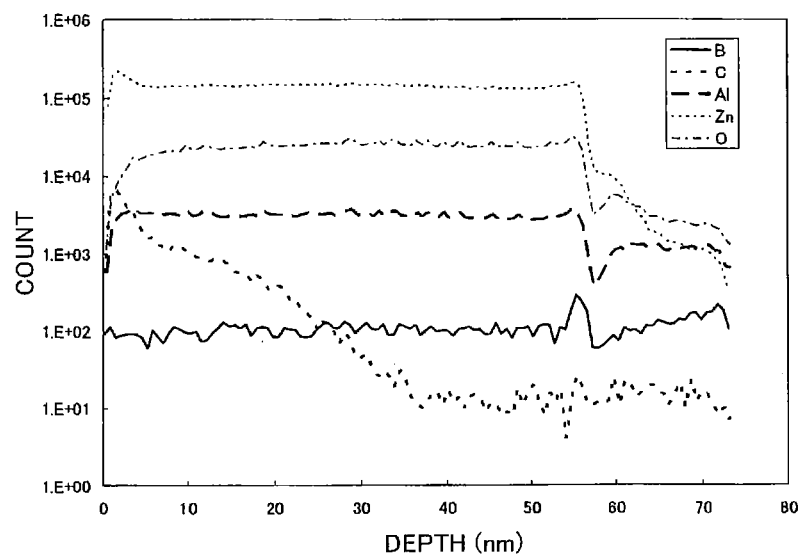
FIG. 7 shows an elemental depth profile of the transparent electroconductive oxide layer prepared by the second comparative example.

FIG. 7 shows an elemental depth profile of the transparent electroconductive oxide layer prepared by the Comparative Example 2, which was measured by the SIMS method. The figure indicates that carbon was contained in a region of 20 nm in the vicinity of the surface of the sample and that aluminum as the impurity remained unchanged in concentration.

Comparison with the result of the Example 1 has confirmed that a lower temperature of the substrate in the formation of the highly-conductive treated layer failed to facilitate diffusion of the impurity into an inner region of the transparent electroconductive oxide layer, resulting in reduction of a thickness of the highly-conductive treated layer. However, by the four-probe measurement, the transparent electroconductive oxide layer prepared by the Comparative Example 2 had a sheet resistance of 1.55 times of that in the Comparative Example 1, which has not been subjected to the highly-conductive treatment. That means the treatment in which the second impurity was not introduced failed to improve the electroconductivity. The above-mentioned results revealed that the highly-conductive treatment in which the second impurity is not introduced fails to improve the electroconductivity though increasing the transmittance of the transparent electroconductive oxide layer, rendering the problem difficult to be solved.

Comparative Example 3

A transparent electroconductive oxide layer was prepared in the same manner as the Example 1. The highly-conductive treatment was performed with a plasma CVD device for 20 minutes using 310 sccm of hydrogen and 0.05 sccm of diborane as materials and the substrate set at 130 degrees centigrade with a discharge power of 200 W. This treatment in the Comparative Example 3 allowed the transparent electroconductive oxide layer to have a 0.80 times of a sheet resistance compared with the sample in Comparative Example 1, which has not been subjected to the highly-conductive treatment and a transmittance of the film to remain unchanged.

Example 3 and Comparative Example 4

A transparent electroconductive oxide layer of Example 3 was prepared upon the first embodiment described making reference to FIG. 1. Glass was used for a transparent substrate 1, on which a transparent electroconductive oxide layer 2 consisting of $SnO_2$ having a film thickness of 800 nm, a sheet resistance of 10Ω/Sq. (ohms per square), and a haze rate of 15 to 20% was deposited. Further, on the layer 2, a boron-doped p-type silicon carbide (SiC) layer of 10 nm, a non-doped amorphous silicon photoelectric conversion layer of 200 nm, and a phosphorus-doped n-type μc-Si layer of 20 nm were respectively film-formed by a plasma CVD method, thereby forming a PIN junction amorphous silicon photoelectric conversion unit 4.

After formation of the photoelectric conversion unit 4, the unit 4 was put in a film-forming chamber of a plasma CVD device for forming the further transparent electroconductive oxide layer 2 consisting of zinc oxide by a sputtering method. This formation was performed using zinc oxide added with 2 wt % of Al as a sputter target, Ar gas as a sputter gas, and the substrate set at 150 degrees centigrade under a pressure of 0.27 Pa, so as to give a film thickness of 40 nm of zinc oxide by a DC sputtering method. After film-forming of the oxide layer, a highly-conductive treated layer 3 was formed by a highly-conductive treatment with a plasma CVD device for 20 minutes using 30 sccm of methane (in concentration of 100% by volume), 310 sccm of hydrogen, and 0.05 sccm of diborane as materials and the substrate set at 130 degrees centigrade with a discharge power of 200 W. A Comparison Example 4 was prepared in the same manner as the Example 3 without formation of the highly-conductive treated layer.

Figure 8:
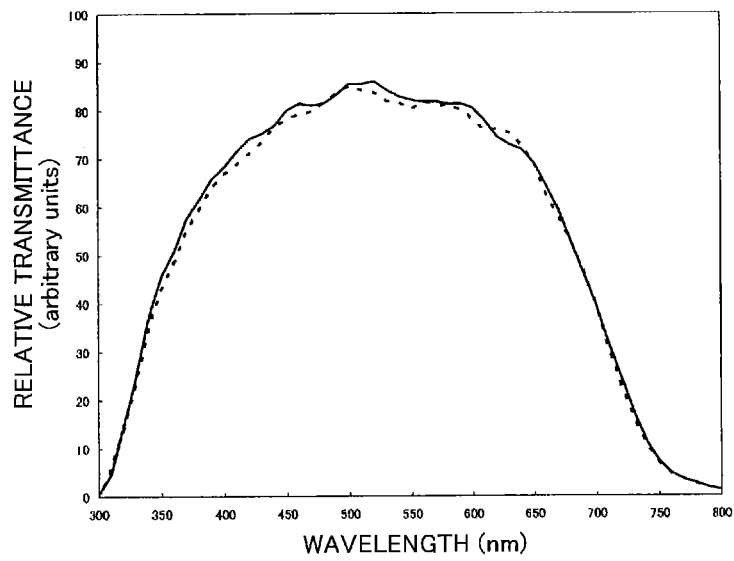
FIG. 8 shows relative collection efficiencies of thin-film photoelectric converters prepared by the examples of the present invention.

Further, an Ag film having a thickness of 300 nm was formed as a back electrode layer 5 by a sputtering method. A photoelectric conversion unit having a light-receiving area of one square centimeter was separated from an amorphous silicon solar cell obtained in the above-mentioned manner. FIG. 8 shows a result of measurement of spectral sensitivity characteristics for assessing an amount of incident light into the separated photoelectric conversion unit.

In the figure, a solid line and a dotted line denote spectral sensitivity characteristics of the photoelectric converters of the Example 3 and the Comparative Example 4 respectively. The figure indicates that the spectral sensitivity of the photoelectric converter of the Example 3 was improved in a short-wavelength range of a wavelength of 550 nm or less, compared with that of the Comparative Example 4.

The invention claimed is:

1. A method of forming a transparent electroconductive oxide layer deposited on a substrate and containing a first and a second impurities and carbon atoms, the layer having a first surface on the opposite side of the layer from the substrate and further an inner region,
the first and the second impurities being contained in a higher concentration in the vicinity of the first surface than the inner region, and
the carbon atoms being contained at least in the vicinity of the first surface,
the method comprising the steps of:
depositing the transparent electroconductive oxide layer containing the first impurity on the substrate, and
plasma-treating the substrate having the deposited transparent electroconductive oxide layer containing the first impurity, in an atmosphere containing hydrocarbon gas and dopant gas containing the second impurity.

2. The method as defined in claim 1,
wherein the hydrocarbon gas is composed of one selected from a group consisting of ethane, acetylene, and methane.

* * * * *